US008987113B2

(12) United States Patent
Hsu et al.

(10) Patent No.: US 8,987,113 B2
(45) **Date of Patent: *Mar. 24, 2015**

(54) IMAGE SENSOR INCLUDING MULTIPLE LENSES AND METHOD OF MANUFACTURE THEREOF

(71) Applicant: Taiwan Semiconductor Manufacturing Company, Ltd., Hsin-Chu (TW)

(72) Inventors: Tzu-Hsuan Hsu, Kaohsiung (TW); Dun-Nian Yaung, Taipei (TW); Yean-Kuen Fang, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/087,370

(22) Filed: Nov. 22, 2013

(65) Prior Publication Data

US 2014/0061837 A1 Mar. 6, 2014

Related U.S. Application Data

(63) Continuation of application No. 10/939,894, filed on Sep. 13, 2004, now abandoned.

(51) Int. Cl.
*H01L 31/0232* (2014.01)
*H01L 27/146* (2006.01)

(52) U.S. Cl.
CPC .... *H01L 27/14625* (2013.01); *H01L 27/14621* (2013.01); *H01L 27/14685* (2013.01)
USPC ................ 438/432; 438/71; 438/70; 257/434

(58) Field of Classification Search
CPC .................. H01L 27/14625; H01L 27/14621; H01L 27/14685
USPC .................................... 438/72; 257/432, 433
See application file for complete search history.

(56) References Cited

U.S. PATENT DOCUMENTS 4,721,999 A * 1/1988 Takemura et al. ............ 348/276
4,952,525 A * 8/1990 van der Plas ................. 438/443
5,278,105 A * 1/1994 Eden et al. .................... 438/129
5,323,052 A * 6/1994 Koyama ........................ 257/432
5,371,397 A * 12/1994 Maegawa et al. ............. 257/432
5,400,072 A * 3/1995 Izumi et al. .................. 348/335
5,593,913 A * 1/1997 Aoki .............................. 438/69
5,595,930 A * 1/1997 Baek .............................. 438/60
5,844,290 A * 12/1998 Furumiya ..................... 257/432
5,986,704 A * 11/1999 Asai et al. ..................... 348/340
6,030,852 A * 2/2000 Sano et al. ...................... 438/69
6,066,511 A * 5/2000 Fukusyo ......................... 438/60
6,168,966 B1 * 1/2001 Fan et al. ........................ 438/73
6,171,885 B1 * 1/2001 Fan et al. ........................ 438/70
6,188,094 B1 * 2/2001 Kochi et al. .................. 257/232
6,255,640 B1 * 7/2001 Endo et al. ................. 250/208.1
6,259,083 B1 * 7/2001 Kimura ...................... 250/208.1

(Continued)

*Primary Examiner* — Jarrett Stark
(74) *Attorney, Agent, or Firm* — Haynes and Boone, LLP

(57) ABSTRACT

A device includes an image sensing element. The device also includes a Silicon Dioxide ($SiO_2$) layer, located over the image sensing element, exhibiting a first index of refraction. The device further includes a first lens, located over the $SiO_2$ layer, exhibiting a second index of refraction greater than the first index of refraction. The device still further includes a color filter located over the first lens and a second lens located over the color filter.

20 Claims, 4 Drawing Sheets

110 100 1X1 NX1 1XM NXM

(56) References Cited

U.S. PATENT DOCUMENTS

| | | | | |
|---|---|---|---|---|
| 6,271,103 | B1 * | 8/2001 | Lee | 438/464 |
| 6,348,361 | B1 * | 2/2002 | Lee et al. | 438/70 |
| 6,379,992 | B2 * | 4/2002 | Jo | 438/70 |
| 6,407,415 | B2 * | 6/2002 | Lee | 257/215 |
| 6,583,438 | B1 * | 6/2003 | Uchida | 257/59 |
| 6,624,404 | B2 * | 9/2003 | Lee et al. | 250/208.1 |
| 6,803,250 | B1 * | 10/2004 | Yaung et al. | 438/70 |
| 2001/0010952 | A1 * | 8/2001 | Abramovich | 438/151 |
| 2002/0063214 | A1 * | 5/2002 | Hsiao et al. | 250/338.4 |
| 2004/0012707 | A1 * | 1/2004 | Fukusho et al. | 348/340 |

* cited by examiner

IMAGE SENSOR INCLUDING MULTIPLE LENSES AND METHOD OF MANUFACTURE THEREOF

PRIORITY DATA

The present application is a continuation application of U.S. patent application Ser. No. 10/939,894, filed Sep. 13, 2004, which is incorporated herein by reference in its entirety.

FIELD OF DISCLOSURE

The present disclosure relates generally to the field of microelectronic devices and, more particularly, an image sensor including multiple lenses and method of manufacture thereof.

BACKGROUND

Various digital imaging devices (e.g., digital cameras) use image sensors, such as charge-coupled device ("CCD") imaging sensors and complementary metal oxide semiconductor ("CMOS") image sensors. Such image sensors include a two dimensional array of photo receptor devices (e.g., photodiodes), each of which is capable of converting a portion of an image to an electronic signal (e.g., representing a "pixel"). Some devices (e.g., a display device) are capable of receiving one or more signals from multiple photo-receptor devices of an image sensor and forming (e.g., reconstructing) a representation of the image.

A photo-receptor device stores a signal in response to intensity or brightness of light associated with an image. Thus, for an image sensor, sensitivity to light is important.

Accordingly, what is needed is an image sensor with improved sensitivity to light.

BRIEF DESCRIPTION OF THE DRAWINGS

In the accompanying figures, in accordance with the standard practice of the industry, various features are not drawn to scale. In fact, dimensions of the various features may be shown to have increased or reduced for clarity.

DETAILED DESCRIPTION

Figure 1:
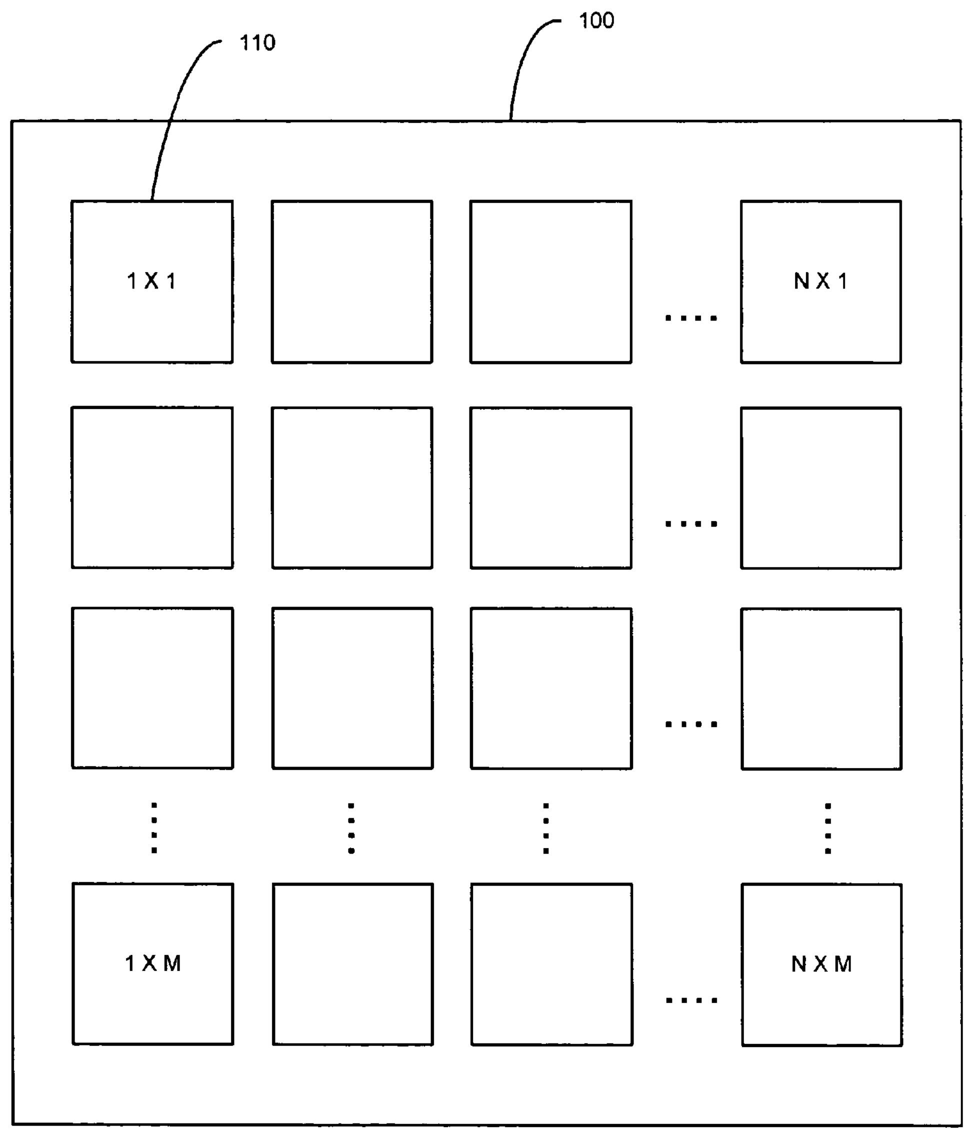
FIG. 1 is a block diagram of an image sensor according to the illustrative embodiment.

The following discussion references various embodiments, and/or examples for implementing different features of the various embodiments. Also, specific examples of components and arrangements are described for clarity, and are not intended to limit the scope this disclosure. Moreover, the following discussions repeat reference numerals and/or letters in the various examples, and such repetitions are also for clarity and does not itself indicate a relationship between the various embodiments and/or configurations discussed. Still further, references indicating formation of a first feature over or on a second feature include embodiments in which the features are formed in direct contact, and also embodiments in which one or more additional features are formed, interposing the first and second features, such that the first feature and the second feature are not in direct contact.

FIG. 1 is a block diagram of an image sensor 100 according to the illustrative embodiment. In the illustrative embodiment, the image sensor 100 is a charged coupled device ("CCD") image sensor. However in other embodiments, the image sensor 100 is another type of image sensor, such as a complementary metal oxide semiconductor ("CMOS") image sensor.

The image sensor 100 includes photo-receptor devices (e.g., photodiodes) 110. Each of the photo-receptor devices 110 is substantially similar to one another. The photo-receptor devices 110 are organized according to a two dimensional array. As shown, the array includes N columns and M rows. Accordingly, the quantity of photo-receptor devices 110 included by the image sensor 100 is represented by a number resulting from multiplying N by M. Information (e.g., electronic signal) stored by each of the photo-receptor devices 110 is capable of representing a "pixel" of an image (e.g., an image displayed by a display device). Thus, the number resulting from multiplying N by M is also capable of representing a resolution (e.g., screen resolution) for such an image.

Figure 2:
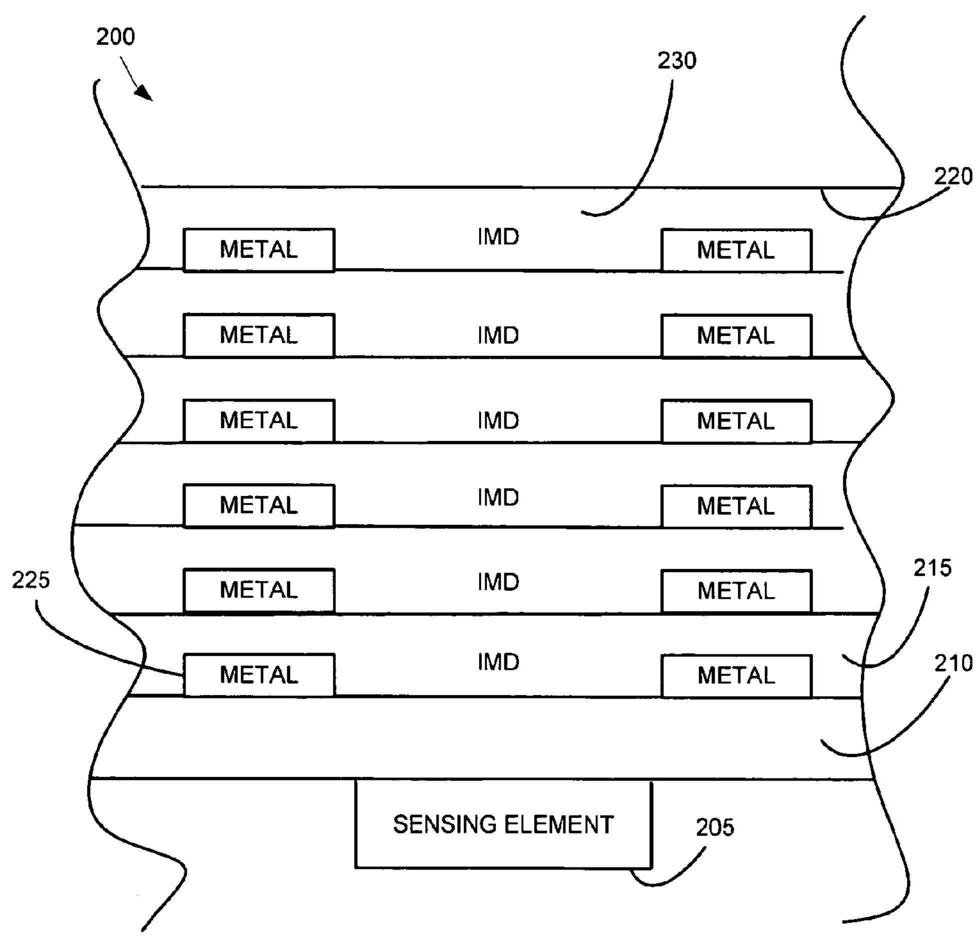
FIGS. 2-4 are successive sectional views of a photo-receptor device according to the illustrative embodiment.

FIG. 2 is a sectional view of a photo-receptor device (e.g., one of the photo-receptor devices 110), indicated generally at 200, in an initial stage of manufacture according to the illustrative embodiment. The photo-receptor device 200 includes a sensing element 205 that reacts to light (e.g., a light beam). In one embodiment, the sensing element 205 includes a pn-junction device (e.g., a diode). The photo-receptor device 200 also includes at least one dielectric layer 210, and one or more inter-metal-dielectric ("IMD") layers 215. Moreover, the photo-receptor device 200 includes a "top" (e.g., upper most) IMD layer 220, which is one of the layers included by the IMD layers 215. Each of the IMD layers 215 includes a metal layer 225 as shown. Also, each of the IMD layers 215 includes a dielectric layer. For example, the IMD layer 220 includes a dielectric layer 230, which is a part of the IMD layer 220.

In the illustrative embodiment, the dielectric layer 230 includes $SiO_2$. The dielectric layer 230 is formed by atomic layer deposition ("ALD"), chemical vapor deposition ("CVD"), such as plasma-enhanced CVD ("PECVD"), high density plasma CVD ("HDP-CVD"), and low pressure CVD ("LPCVD"), evaporation, or any other suitable technique. Notably, with PECVD, tetraethoxysilane ("TEOS") is used to form the $SiO_2$ dielectric layer 230.

After its formation, the dielectric layer 230 is planarized. Examples of planarizing techniques include thermal flow, sacrificial resist etch-back, spin-on glass, and chemical-mechanical planarization ("CMP"). In particular, CMP is a technique for planarizing various disparate types of materials, such as dielectric and metal materials. CMP is capable of selectively removing materials from a layer (e.g., a layer of a wafer) by mechanical polishing that is assisted by one or more chemical reactions.

In more detail, with conventional CMP, a wafer is mounted with its face down on a carrier. The carrier is pressed against a moving platen that includes a polishing surface (e.g., a polishing pad). While the carrier is rotated about its axis, aqueous material including abrasive elements is dripped onto the polishing pad so that the centrifugal force formed by rotating the carrier distributes the aqueous material on the polishing pad. Accordingly, via a combination of mechanical polishing and chemical reaction, CMP selectively removes a portion of a layer of the wafer.

Figure 3:
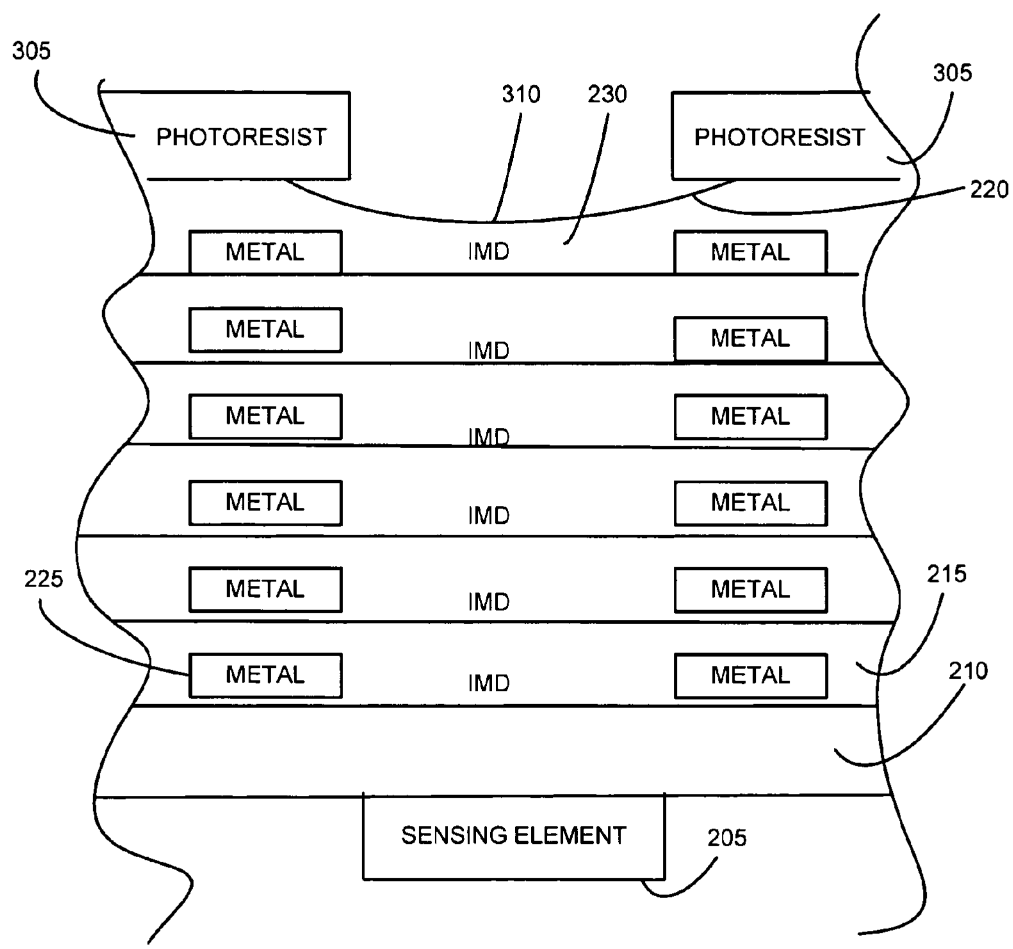

FIG. 3 is a sectional view of the of the photo-receptor device 200, in a subsequent stage of manufacture according to the illustrative embodiment. At this stage, a curved recess 310 is formed on the dielectric layer 230. The curved recess 310 is formed by using conventional photo-lithography and etching techniques. In one example, the curved recess is formed by patterning the dielectric layer 230 with a sequence of processes that includes: photo-resist patterning, wet etching, and photo-resist stripping. Also, the photo-resist patterning includes: photo-resist coating, "soft baking", mask alignment, pattern exposure, photo-resist development, and "hard baking". Moreover, wet etching is isotropic etching, and accordingly, suitable for forming the curved recess 310.

In more detail, in forming the curved recess 310, a photo-resist layer 305 is formed over the dielectric layer 230 as shown in FIG. 3. After forming the photo-resist layer 305, wet etching is performed on the dielectric layer 230. Subsequently, the photo-resist layer 305 is removed. Although in the illustrative embodiment, the curved recess 310 is formed using photo-lithography/wet-etching, in other embodiments, the curved recess 310 is formed using one or more other suitable techniques such as maskless lithography.

Figure 4:
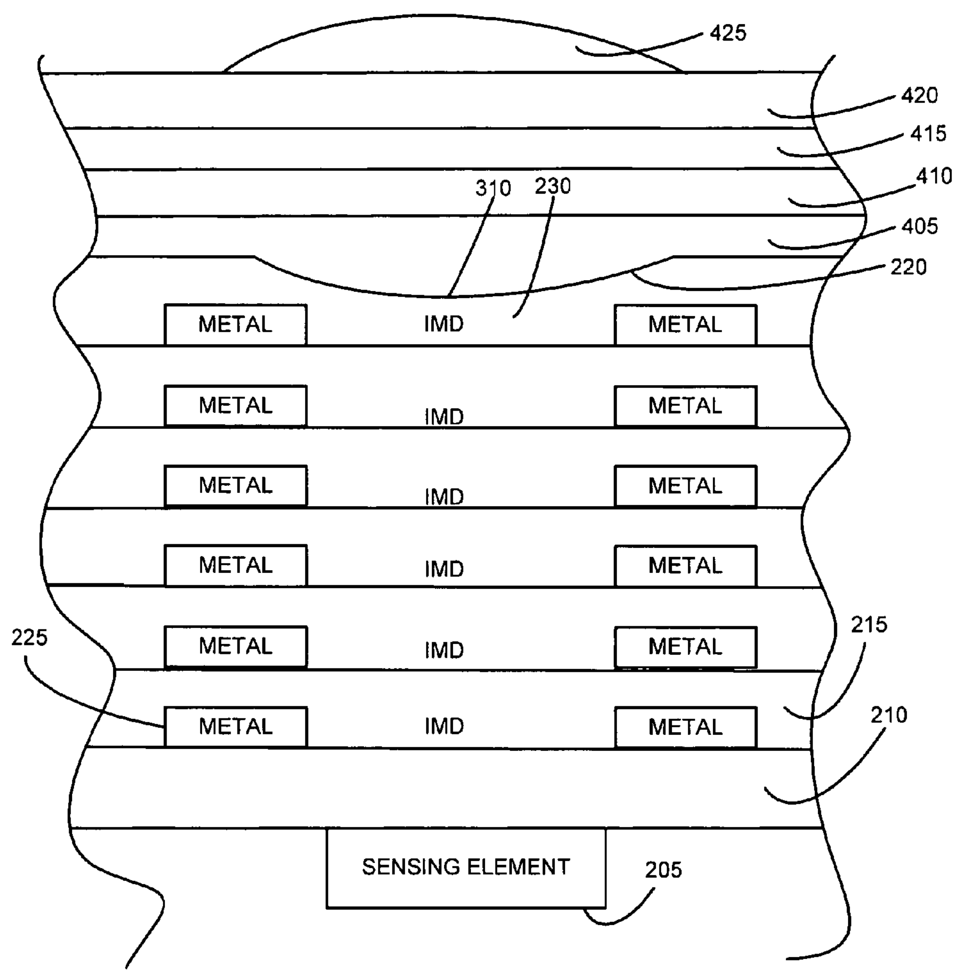

FIG. 4 is a sectional view of the of the photo-receptor device 200, in a subsequent stage of manufacture according to the illustrative embodiment. At this stage of manufacture, the photo-receptor device 200 includes the dielectric layer 230, which includes the curved recess 310. Over the dielectric layer 230 and its curved recess 310, a lens 405 is formed. In the illustrative embodiment, the lens 405 includes SiN, SiON, or any other suitable material. Also, examples of techniques used to form the lens 405 include ion implantation of N, sputtering, ALD, and CVD such as PECVD, LPCVD, and HDP-CVD. In one example, NH3 and HCD are used in association with LPCVD to form the lens 405 that includes SiN. As shown, the lens 405 is a convex lens.

The photo-receptor device 200 also includes a spacer 410, which is formed over the lens 405. In the illustrative embodiment, the spacer 410 includes SiO2, polymer or any other material suitable for electrical insulation and planarization. Moreover, the photo-receptor device 200 includes a color filter layer 415 formed over the spacer 410. In the illustrative embodiment, the color filter layer 415 includes a resin, such as a pigment-dispersed resin or polymer. A spacer 420, which is substantially similar to the spacer 410, is formed over the color filter layer 415 as shown in FIG. 4.

In addition to the lens 405, the photo-receptor device 200 includes a lens 425. The lens 425 is substantially similar to the lens 405. Accordingly, techniques used to form the lens 425 are substantially similar to the techniques used for forming the lens 405 as discussed above. Materials used to form lens 425 include a resin, such as a pigment-dispersed resin or polymer. The various layers between the lens 425 and the sensing element 205 are sufficiently transparent to pass light from lens 425 to the sensing element 205.

As discussed above, the photo-receptor device 200 is capable of forming (e.g., converting) a portion of an image as an electronic signal. The photo-receptor device 200 forms such electronic signal in response to light (e.g., a light beam), from an optical image, that is received through the lenses 405 and 425, the color filter layer 415, and the IMD layers 215.

A light beam passing from one type of medium (e.g., the lens 405) to another medium (e.g., the dielectric layer 230) is typically affected by refraction. An example of refraction can be observed when a light beam passes from air to water. An amount of refraction for a specified medium is characterized by its index of refraction. In one example, index of refraction is characterized by the following mathematical expression.

$$n=c/v_{phase}$$

In the above expression, c is the speed of light and $v_{phase}$ is the phase velocity.

As discussed above, for the photo-receptor device 200, light sensitivity of the image sensing element 205 is important. It has been observed that, in general, light sensitivity can be improved by receiving light from a large pixel area and focusing the light on a small image sensing element. For improving the light sensitivity of the image sensing element 205, the photo-receptor device 200 includes the lenses 405 and 425 as discussed above. Also for improving the light sensitivity of the image sensing element 205, an index of refraction for the lens 405 is greater than an index of refraction for the dielectric layer 230.

For example, in one version of the illustrative embodiment, the lens 405 includes SiN and the dielectric layer 230 includes $SiO_2$. According to one measured value, an index of refraction for SiN is approximately 2.01 and an index of refraction for $SiO_2$ is 1.46. Thus, the index of refraction for the lens 405 (2.01) is greater than the index of refraction for the dielectric layer 230 (1.46).

Although illustrative and alternative embodiments have been shown and described, a wide range of modification, change, and substitution is contemplated in the foregoing disclosure and, in some instances, some features of the embodiments may be employed without a corresponding use of other features. Accordingly, broad constructions of the appended claims in manners consistent with the scope of the embodiments disclosed are appropriate.

What is claimed is:

1. A device comprising:

an image sensing element embedded within a substrate;

a first and second inter-metal dielectric (IMD) layers disposed over the image sensing element, wherein each of the first and second IMD layers includes a metal layer;

a top IMD layer of substantially undoped silicon oxide disposed the first and second IMD layers, wherein the top inter-metal dielectric layer has a top surface and an opposing planar bottom surface, the bottom surface interfacing the second IMD layer above the image sensing element, and wherein the to surface includes a recess extending towards the image sensing element, and wherein a point on the recess of the top surface nearest the image sensing element is within the top inter-metal dielectric layer, spaced a distance from the bottom surface of the top IMD layer and lies directly above the first and second IMD layers;

a first lens disposed over and physically contacting the top IMD layer, wherein the first lens includes a first portion disposed within the recess of the top IMD layer and a second portion that is not disposed within the recess of the top IMD layer, wherein the first lens exhibits a second refractive index that is greater than the first refractive index, wherein the first lens does not extend below the first plane;

a color filter layer disposed over the first lens; and a second lens disposed over the color filter, wherein the second lens has a convex top surface facing away from the substrate, wherein the second lens exhibits a third refractive index that is greater than the first refractive index.

2. The device of claim 1, wherein the second inter-metal dielectric layer is disposed below the first lens such that no portion of the second inter-metal dielectric layer is disposed over the first lens.

3. The device of claim 1, wherein the first portion has a first surface that is convex and the second portion has a second surface that is substantially planar.

4. The device of claim 3, wherein the first surface and the second surface interface with each other at an outermost edge of the recess.

5. The device of claim 1, further comprising a first and second spacer layers, wherein the color filter interposing the first and second spacer layers, and wherein the first spacer layer is formed of as first material and the second spacer layer is formed of a second material that is different than the first material.

6. The device of claim 5, wherein the first and second spacer layers are formed of a polymer material.

7. A device comprising:

an image sensing element disposed on a substrate;

a first inter-metal dielectric layer disposed over the dielectric layer, the first inter-metal dielectric layer having a top surface and an opposing bottom surface that are substantially parallel with respect to each other, wherein the top surface of the first inter-metal dielectric layer faces away from the substrate and the bottom surface of the first inter-metal dielectric layer faces the substrate, wherein a plurality of conductive features are disposed in the first inter-metal dielectric layer lying between the top surface and the bottom surface;

a second inter-metal dielectric layer disposed over the first inter-metal dielectric layer, wherein the second inter-metal dielectric, layer includes a top surface and an opposing bottom surface, wherein the top surface includes a first portion having a concave profile and a second portion that is substantially parallel to the to surface of the first inter-metal dielectric layer and wherein the bottom surface is substantially parallel to the top surface of the first inter-metal dielectric layer, wherein the second inter-metal dielectric layer exhibits a first refractive index;

a first lens disposed over and physically contacting the second inter-metal dielectric layer, wherein the first lens includes a top surface that is substantially parallel to the top surface of the first inter-metal dielectric layer and a bottom surface that includes a first portion having a convex profile and interfacing with the concave profile of the second inter-metal dielectric layer and a second portion that is substantially parallel to the top surface of the first inter-metal dielectric layer, wherein the first lens exhibits a second refractive index that is greater than the first refractive index, wherein the first lens does not extend below the bottom surface of the second inter-metal dielectric layer and wherein a point on the convex profile of the first lens nearest the image sensing element is disposed above and in line with the bottom surface of the second inter-metal dielectric layer and the top, and bottom surface of the first inter-metal dielectric layer;

a color filter layer disposed over the first lens; and a second lens disposed over the color filter, wherein the second lens has a top surface facing away from the substrate that has a convex profile and a bottom surface that is substantially parallel to the to surface of the first inter-metal dielectric layer.

8. The device of claim 7, wherein the to surface of the second lens intersects the bottom surface of the second lens such that the top surface of the second lens does not extend beyond the bottom surface of the second lens and the bottom surface of the second lens does not extend beyond the top surface of the second lens.

9. The device of claim 7, wherein the first lens includes SiN and the second lens includes a material different than SiN.

10. The device of claim 7, wherein the second lens exhibits a third refractive index that is greater than the first refractive index.

11. The device of claim 7, further comprising a third inter-metal dielectric layer disposed under the first and second inter-metal dielectric layers, the third inter-metal dielectric layer having a top surface and an opposing bottom surface that are substantially parallel with respect to each other, wherein the top surface of the third inter-metal dielectric layer faces away from the substrate and the bottom surface of the third inter-metal dielectric layer faces the substrate, and wherein the third inter-metal dielectric layer has at least one metal feature in the layer between the top and bottom surfaces of the third inter-metal dielectric layer.

12. The device of claim 7, wherein the second inter-metal dielectric layer physically contacts the first inter-metal dielectric layer and the first inter-metal dielectric layer physically contacts the third inter-metal dielectric layer.

13. The device of claim 7, wherein the second inter-metal dielectric layer includes substantially undoped $SiO_2$.

14. The device of claim 7, wherein no portion of the second inter-metal dielectric layer is disposed over the first lens.

15. A device comprising:

an image sensing element embedded within a substrate;

a dielectric layer disposed over the image sensing device;

a first inter-metal dielectric layer disposed over and physically contacting the dielectric layer, wherein the first inter-metal dielectric layer includes a first metal layer between the first inter-metal dielectric layer top surface and bottom surface;

a second inter-metal dielectric layer disposed over the first inter-metal dielectric layer, wherein the second inter-metal dielectric layer includes a second metal layer between the second inter-metal dielectric Layer top surface and bottom surface, wherein the second inter-metal dielectric layer includes a recess contained within the second inter-metal dielectric layer extending towards the image sensing element such that a portion of the second inter-metal dielectric layer and the first inter-metal dielectric layer is disposed below the recess, wherein the second inter-metal dielectric layer exhibits a first refractive index;

a first lens layer disposed over and within the recess of the second inter-metal dielectric layer, wherein the first lens layer has an overall width in a first direction that is substantially parallel to is top surface of the substrate, wherein the first lens exhibits a second refractive index that is greater than the first refractive index;

a color filter layer disposed over the first lens layer; and a second lens layer disposed over the color filter layer, wherein the second lens layer has a convex to surface facing away from the substrate, wherein the second lens layer has an overall width in the first direction such that the overall width of the second lens layer is less than the overall width of the tint lens layer.

16. The device of claim 15, wherein the second lens exhibits a third refractive index that is greater than the first refractive index.

17. The device of claim 15, wherein the first lens includes a portion disposed outside of the recess that does have the second lens directly thereover.

18. The device of claim 15, further comprising a second spacer layer interposing the color filter layer and the second lens layer, wherein second spacer layer has an overall width in the first direction that is greater than the overall width of the second lens layer.

19. The device of claim 15, further comprising a first spacer layer interposing the first lens and the color filter layer and a second spacer layer interposing the color filter layer and the second lens layer, and wherein the first and second spacer layers are formed of a polymer material.

20. The device of claim 15, wherein the second metal layer includes a first metal portion and a second metal separated by a dielectric material the second inter-metal dielectric layer, and wherein the first lens layer extends continuously over the entire first metal portion, the entire second metal portion, and the entire dielectric material.

* * * * *